US012690490B2

(12) United States Patent
Jung

(10) Patent No.: US 12,690,490 B2
(45) Date of Patent: Jul. 21, 2026

(54) DISPLAY DEVICE INCLUDING MULTIPLE FLEXIBLE PRINTED CIRCUIT BOARDS AND ELECTRODE, LINE, AND VIA INTERCONNECTIONS FOR SERIES-DISPOSED LIGHT EMITTING DIODES

(71) Applicant: LG Display Co., Ltd., Seoul (KR)

(72) Inventor: YeounJei Jung, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 800 days.

(21) Appl. No.: 17/964,855

(22) Filed: Oct. 12, 2022

(65) Prior Publication Data

US 2023/0119003 A1 Apr. 20, 2023

(30) Foreign Application Priority Data

Oct. 14, 2021 (KR) ........................ 10-2021-0136728

(51) Int. Cl.
*H10W 90/00* (2026.01)
*H05K 1/189* (2026.01)
*H10H 20/831* (2025.01)
*H10H 20/857* (2025.01)

(52) U.S. Cl.
CPC ............ *H10W 90/00* (2026.01); *H05K 1/189* (2013.01); *H10H 20/8312* (2025.01); *H10H 20/857* (2025.01); *H05K 2201/10128* (2013.01)

(58) Field of Classification Search
CPC .. H01L 25/0753; H05K 1/147; H10D 86/441; H10H 20/83; H10H 20/8312; H10H 29/142
See application file for complete search history.

(56) References Cited

U.S. PATENT DOCUMENTS

2020/0081295 A1* 3/2020 Oh ..................... G02F 1/133308
2021/0357082 A1* 11/2021 Yang ..................... G06F 3/0443
2022/0263000 A1* 8/2022 Yang ................. G02F 1/133603

FOREIGN PATENT DOCUMENTS

| CN | 101026183 A | 8/2007 |
| CN | 103094300 A | 5/2013 |
| CN | 107886853 A | 4/2018 |
| CN | 110888262 A | 3/2020 |
| KR | 2010-0009910 A | 1/2010 |

(Continued)

*Primary Examiner* — Wael M Fahmy
*Assistant Examiner* — Shamita S Hanumasagar
(74) *Attorney, Agent, or Firm* — Seed Intellectual Property Law Group LLP

(57) ABSTRACT

A display device according to an embodiment of the present disclosure includes a main FPCB including a plurality of LEDs in a block unit on one surface and a connector connected to the LEDs on the other surface, a sub-FPCB connected to the connector of the main FPCB, and a cover bottom in which the main FPCB is disposed and the sub-FPCB is connected to the outside through an open area. In each block, the plurality of LEDs is disposed in series by a plurality of first connection electrodes and second connection electrodes. Also, wherein the first and second via holes are disposed within the blocks, and one end of the first connection electrode and one end of the second connection electrode are exposed by a first via hole and a second via hole. Therefore, it is possible to reduce a routing area and a bezel area.

13 Claims, 14 Drawing Sheets

(56)  References Cited

FOREIGN PATENT DOCUMENTS

| KR | 2012-0113387 A | | 10/2012 | | |
|----|----------------|---|---------|---|---|
| KR | 2018-0025411 A | | 3/2018 | | |
| KR | 2019-0068113 A | | 6/2019 | | |
| KR | 10-2020-0028700 A | | 3/2020 | | |
| KR | 20200134359 A | | 12/2020 | | |
| KR | 20210041788 A | * | 4/2021 | .......... | H10H 29/142 |
| KR | 20210079684 A | | 6/2021 | | |

* cited by examiner

DISPLAY DEVICE INCLUDING MULTIPLE FLEXIBLE PRINTED CIRCUIT BOARDS AND ELECTRODE, LINE, AND VIA INTERCONNECTIONS FOR SERIES-DISPOSED LIGHT EMITTING DIODES

CROSS-REFERENCE TO RELATED APPLICATIONS

This application claims the priority of Korean Patent Application No. 10-2021-0136728 filed on Oct. 14, 2021, in the Korean Intellectual Property Office, the disclosure of which is incorporated herein by reference.

BACKGROUND

Technical Field

The present disclosure relates to a display device, and more particularly, to a light emitting diode (LED) display device with a reduced bezel size.

Description of the Related Art

Liquid crystal display (LCD) devices and organic light emitting display (OLED) devices, which have been widely used so far, find more and more applications.

The LCD device and the OLED device have advantages such as a high resolution screen, a small thickness, and a light weight. Therefore, they are widely applied to screens of everyday electronic devices such as mobile phones or notebooks and the applicable range of these devices is gradually expanded.

However, in the LCD device and OLED device, there can be a limitation in reducing the size of a bezel area which does not display an image in the display device but is visible to a user. For example, as for the LCD device, a sealant needs to be used to seal liquid crystals and bond upper and lower substrates. Thus, there is a limitation in reducing the size of the bezel area. Further, as for the OLED device, an organic light emitting diode is made of an organic material and thus vulnerable to moisture or oxygen. Thus, it is necessary to provide an encapsulation unit for protecting the organic light emitting diode and there is a limitation in reducing the size of the bezel area. In particular, it is impossible to implement a super-size screen with a single panel. Thus, when a super-size screen is implemented by tiling a plurality of liquid crystal display panels or a plurality of organic light emitting display panels, a bezel area between adjacent panels can be seen by a user.

As an alternative to this, a light emitting diode (LED) display device including LEDs has been proposed. Since the LED is made of an inorganic material rather than an organic material, it has excellent reliability and has a longer lifespan compared to the LCD device or the OLED device. Further, the LED is suitable for a super-size screen because it exhibits high lighting speed, low power consumption, and high impact resistance, which results in excellent stability, and can display a high-brightness image.

BRIEF SUMMARY

LED display devices may comprise a micro LED display device or a mini LED display device depending on the size of an LED.

In an LED display device, LEDs are designed for each block, which is a minimum unit of a serial configuration of LEDs, to reduce a bezel area, and a film on film (FOF) bonding pad area is reduced. However, in order to reduce the FOF bonding pad area, the order of pads may be changed and the number of layers may be increased according to a via hole avoidance design.

Accordingly, the present inventors have invented an LED display device in which a novel block structure reduces an FOF bonding pad area without a via hole avoidance design and an increase in the number of layers, and, thus, a bezel area can be minimized or reduced.

Also, the present inventors have invented an LED display device in which a sensor unit is provided between LEDs to reduce the space where the sensor unit has been located and which can implement additional functions such as skin care or sterilization.

The technical benefits of the present disclosure are not limited to the above-mentioned benefits, and other benefits, which are not mentioned above, can be clearly understood by those skilled in the art from the following descriptions.

According to one embodiment of the present disclosure, the display device includes a main flexible printed circuit board (FPCB) including a plurality of light emitting diodes (LEDs) in a block on one surface and a connector connected to the plurality of LEDs on the other surface. Also, the display device includes a sub-FPCB connected to the connector of the main FPCB, and a cover bottom in which the main FPCB is disposed and the sub-FPCB is connected to the outside through an open area. In each block, LEDs of the plurality of LEDs are disposed in series by a plurality of first connection electrodes and second connection electrodes. Also, first and second via holes are disposed within the blocks, and one end of the first connection electrode may be exposed by one of the first via holes and one end of the second connection electrode may be exposed by one of the second via holes.

Other detailed matters of the embodiments are included in the detailed description and the drawings.

In a display device according to the present disclosure, a connector between an anode and a cathode and via holes are aligned in a horizontal direction within a block. Also, blocks on and under an open area are connected on the same layer by a connection line or connected on different layers by a connection line through the first and second via holes. Thus, a routing area and a bezel area can be reduced. Therefore, it is possible to reduce costs of a sub-flexible printed circuit board (FPCB) and reduce process errors.

Further, in the display device according to the present disclosure, a sensor unit such as an illumination sensor, a proximity sensor, and a fingerprint sensor is provided between LEDs. Therefore, it is possible to reduce the space where the sensor unit has been located and implement a skin care function using near infrared light or a sterilization function using ultraviolet (UV) light.

The effects of the display device according to embodiments of the present disclosure are not limited to the aforementioned effects, and various other effects are included in the present disclosure.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features, and other advantages of the present disclosure will be more clearly understood from the following detailed description taken in conjunction with the accompanying drawings, in which.

DETAILED DESCRIPTION

Figure 1:
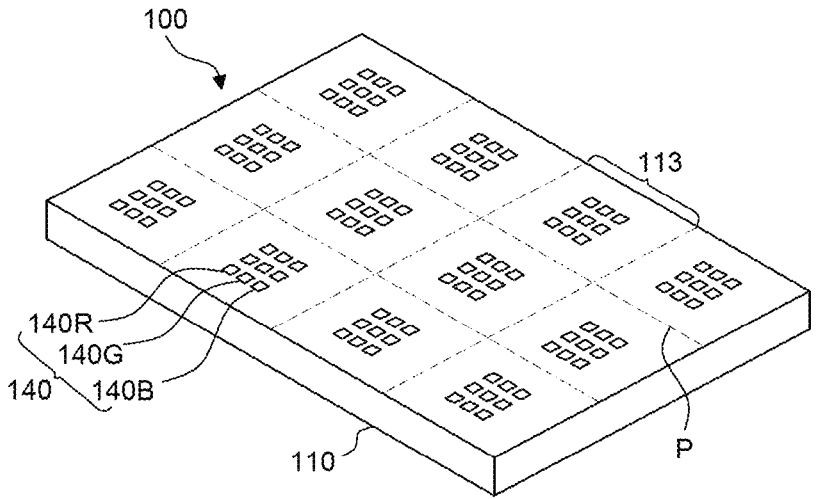
FIG. 1 is a perspective view schematically illustrating an LED assembly according to a first embodiment of the present disclosure.

Advantages and characteristics of the present disclosure and a method of achieving the advantages and characteristics will be clear by referring to embodiments described below in detail together with the accompanying drawings. However, the present disclosure is not limited to the embodiments disclosed herein but will be implemented in various forms. The embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, embodiments of the present disclosure will be described in detail with reference to accompanying drawings.

FIG. 1 is a perspective view schematically illustrating an LED assembly according to a first embodiment of the present disclosure.

Referring to FIG. 1, an LED assembly 100 according to the first embodiment of the present disclosure may be composed of a main flexible printed circuit board (FPCB) 110 and a plurality of LEDs 140 disposed on the main FPCB 110.

A plurality of pixel areas P may be positioned in the main FPCB 110.

The pixel area P may form a block (113), which is a minimum unit of a serial configuration of the LEDs 140.

Although not illustrated in the drawings, the main FPCB 110 may be a TFT array substrate, and a thin film transistor and various lines for driving the LED 140 may be formed in the pixel area P. When the thin film transistor is turned on, a driving signal input from the outside through a line is applied to the LED 140 and the LED 140 emits light. The LED 140 may be used as a backlight or may be used to implement an image.

In each pixel area P of the main FPCB 110, nine LEDs 140R, 140G, and 140B each emitting light of a single color such as R, G, and B are repeatedly disposed. Thus, R, G, and B LEDs 140R, 140G, and 140B may emit light of R, G, and B colors in response to a signal applied from the outside. However, the present disclosure is not limited to the number of LEDs 140R, 140G, and 140B disposed in each pixel area P, e.g., each block.

The LEDs 140R, 140G, and 140B may be manufactured by a process separate from a TFT array process of the main FPCB 110. In a typical organic light emitting display device, both a TFT array substrate and an organic emission layer are formed by a photolithography process. However, in the LED display device according to the present disclosure, the thin film transistor and various lines disposed on the main FPCB 110 are formed by a photolithography process, but the LEDs 140R, 140G, and 140B may be manufactured by a separate process. In this case, the LEDs 140R, 140G, and 140B may be disposed on a substrate 111 by a transfer process, but are not limited thereto.

The LEDs 140 may have a size of several µm to several hundreds of µm. The LEDs 140 may be formed by thin film growing a plurality of inorganic materials such as Al, Ga, N, P, As, In, etc., on a sapphire substrate or a silicon substrate and then cutting and separating the sapphire substrate or the silicon substrate.

As such, the LEDs 140 are formed in a micro-size, and, thus, they may be transferred to a flexible substrate such as a plastic substrate. Therefore, a flexible display device can be manufactured. Further, unlike the organic emission layer, the LED 140 is formed by thin film growing an inorganic material, and, thus, the manufacturing process can be simple and the yield can be improved. Furthermore, the LEDs 140 are simply transferred onto a large area substrate, and, thus, a large area display device can be manufactured. Also, the LEDs 140 made of an inorganic material have advantages such as a high brightness and a long lifespan compared to LEDs manufactured with an organic light emitting material.

Although not illustrated in the drawings, a plurality of gate lines and data lines may be disposed in a vertical or horizontal direction on the main FPCB 110 so as to define the plurality of pixel areas P in a matrix form. In this case, the gate line and the data line are connected to the LED 140, and a gate pad and a data pad each connected to the outside are provided at end portions of the gate line and the data line, respectively. Thus, a signal from the outside may be applied to the LED 140 through the gate line and the data line so that the LED 140 operates to emit light.

Figure 2:
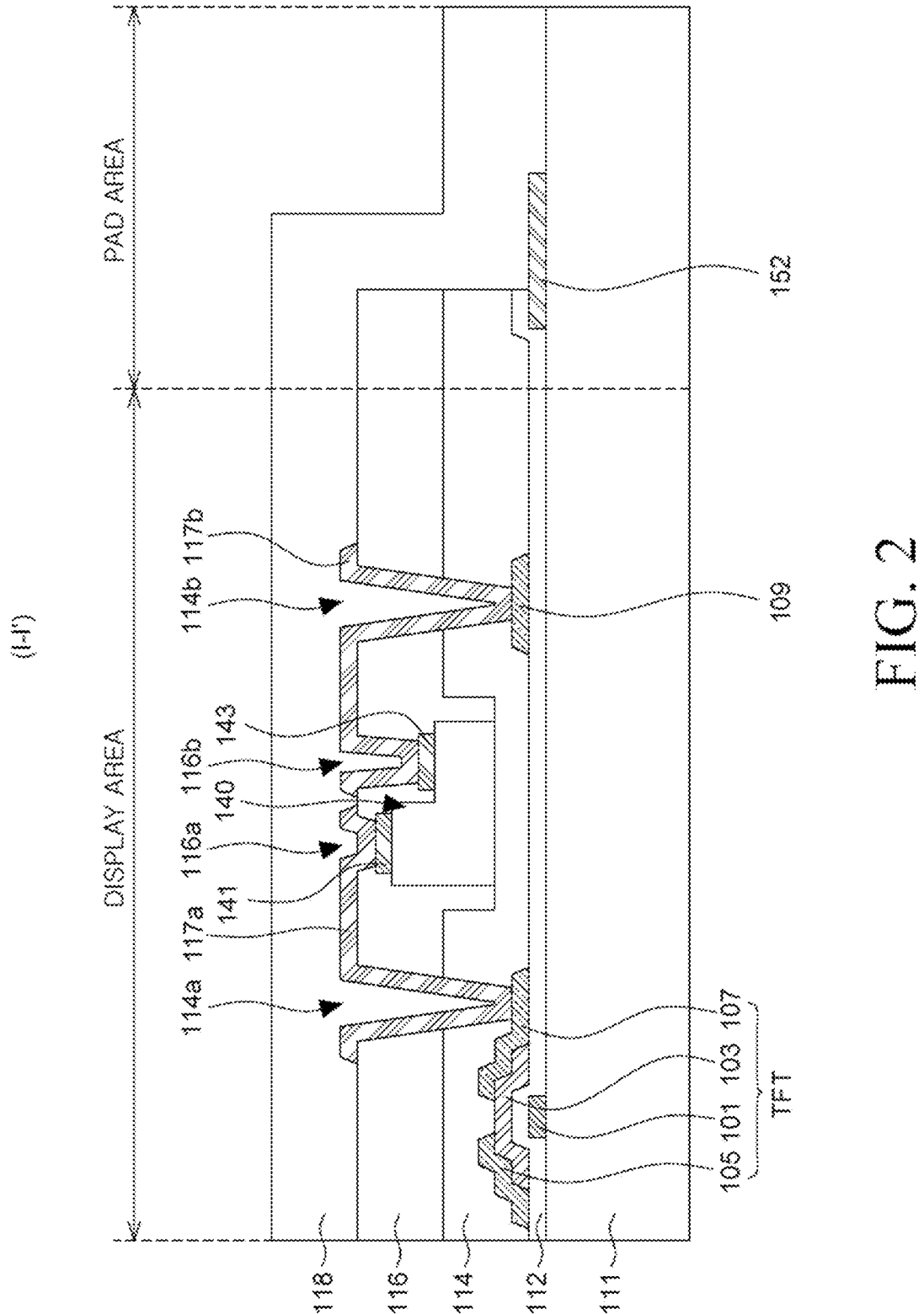
FIG. 2 is a cross-sectional view showing a partial structure of the LED assembly according to the first embodiment of the present disclosure.

FIG. 2 is a cross-sectional view showing a partial structure of the LED assembly according to the first embodiment of the present disclosure. The cross-sectional view of FIG. 2 corresponds to the line I-I' shown in FIGS. 8A and 8B.

For the convenience of description, FIG. 2 illustrates an example of a structure of a sub-pixel disposed at an outer portion of the LED display device. However, the present disclosure is not limited thereto.

Referring to FIG. 2, a thin film transistor TFT may be disposed in a display area of the substrate 111 and a pad 152 may be disposed in a pad area.

The substrate 111 is made of a transparent material such as glass, but it is not limited thereto and may be made of other transparent materials. Also, the substrate 111 may be made of a flexible transparent material.

The thin film transistor TFT may be composed of a gate electrode 101, a semiconductor layer 103, a source electrode 105, and a drain electrode 107.

Referring to FIG. 2, the gate electrode 101 may be formed on the substrate 111. Also, a gate insulating layer 112 may be formed on the entire area of the substrate 111 and may cover the gate electrode 101. Further, the semiconductor layer 103 may be formed on the gate insulating layer 112, and the source electrode 105 and the drain electrode 107 may be formed on the semiconductor layer 103.

The gate electrode 101 may be made of a metal, such as Cr, Mo, Ta, Cu, Ti, Al, or an alloy thereof. The gate insulating layer 112 may be formed as a single layer of an inorganic material such as SiOx or SiNx or a multilayer of SiOx and SiNx.

The semiconductor layer 103 may be made of an amorphous semiconductor, such as amorphous silicon, or an oxide semiconductor, such as indium gallium zinc oxide (IGZO), $TiO_2$, ZnO, $WO_3$, or $SnO_2$. If the semiconductor layer 103 is made of an oxide semiconductor, the size of the thin film transistor TFT can be reduced, a driving power can be reduced and an electric mobility can be improved. However, in the present disclosure, the semiconductor layer of the thin film transistor is not limited to a specific material.

The source electrode 105 and the drain electrode 107 may be made of a metal, such as Cr, Mo, Ta, Cu, Ti, Al, or an alloy thereof. In this case, the drain electrode 107 may serve as a first electrode to apply a signal to the LED 140.

Meanwhile, although the thin film transistor TFT is illustrated as a bottom gate type thin film transistor in the drawings, the present disclosure is not limited thereto. A thin film transistor having various structures such as a top gate type thin film transistor may be applied.

The pad 152 disposed in the pad area may be made of a metal, such as Cr, Mo, Ta, Cu, Ti, Al, or an alloy thereof. The pad 152 may be formed by a different process from the gate electrode 101 of the thin film transistor TFT. However, in order to simplify the process, the pad 152 may also be formed by the same process as the gate electrode 101.

Although not illustrated in the drawings, the pad 152 may be formed on the gate insulating layer 112. In this case, the pad 152 may be formed by a different process from the source electrode 105 and the drain electrode 107 of the thin film transistor TFT. However, in order to simplify the process, the pad 152 may be formed by the same process as the source electrode 105 and the drain electrode 107.

Also, a second electrode 109 may be formed on the gate insulating layer 112 in the display area. In this case, the second electrode 109 may be made of a metal, such as Cr, Mo, Ta, Cu, Ti, Al, or an alloy thereof. Further, the second electrode 109 may be formed by the same process as the source electrode 105 and the drain electrode 107 of the thin film transistor TFT.

Further, a first insulating layer 114 may be formed on the substrate 111 on which the thin film transistor TFT has been formed, and the LED 140 may be disposed on the first insulating layer 114 in the display area. Although it is illustrated in the drawings that a part of the first insulating layer 114 is removed and the LED 140 is disposed in the removed area, the first insulating layer 114 may not be removed. The first insulating layer 114 may be formed as an organic layer, such as photo-acryl, or may have a multilayered structure including an inorganic layer and an organic layer or an inorganic layer, an organic layer, and an inorganic layer.

The LED 140 is mainly made of Group III-V nitride semiconductor materials, but is not limited thereto.

Figure 3:
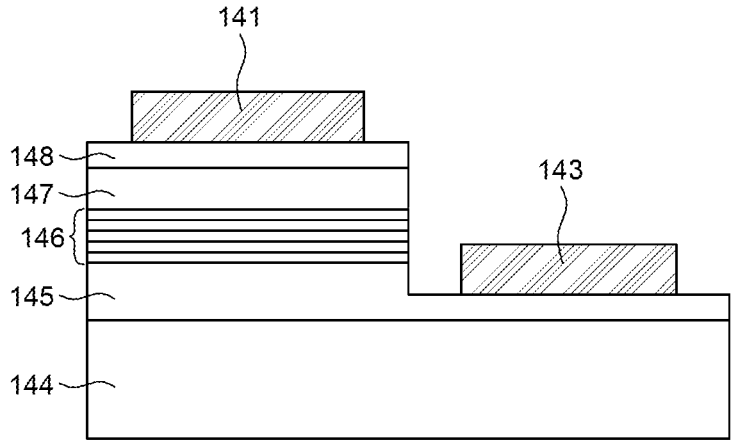
FIG. 3 is a cross-sectional view showing a structure of an LED illustrated in FIG. 2.

FIG. 3 is a cross-sectional view showing a structure of an LED illustrated in FIG. 2.

Referring to FIG. 3, the LED 140 according to the first embodiment of the present disclosure may include, for example, an undoped GaN layer 144 and an n-type GaN layer 145 disposed on the GaN layer 144. Also, the LED 140 may include, for example, an active layer 146 having a multi-quantum well (MQW) structure and disposed on the n-type GaN layer 145, and a p-type GaN layer 147 disposed on the active layer 146. Further, the LED 140 may include, for example, an ohmic contact layer 148 made of a transparent conductive material and disposed on the p-type GaN layer 147, and a p-type electrode 141 in contact with a part of the ohmic contact layer 148. Furthermore, the LED 140 may include, for example, an n-type electrode 143 in contact with a part of the n-type GaN layer 145 that is exposed by etching a part of the active layer 146, the p-type GaN layer 147, and the ohmic contact layer 148.

The n-type GaN layer 145 is a layer for supplying electrons into the active layer 146, and may be formed by doping a GaN semiconductor layer with n-type impurities, such as Si.

The active layer 146 is a layer in which the injected electrons and holes are combined to emit light.

The MQW structure of the active layer 146 includes a plurality of barrier layers and well layers alternately disposed. The well layers are formed as InGaN layers and the barrier layers are formed as GaN layers, but are not limited thereto.

The p-type GaN layer 147 is a layer for injecting holes into the active layer 146, and may be formed by doping a GaN semiconductor layer with p-type impurities, such as Mg, Zn, and Be.

The ohmic contact layer 148 is a layer for an ohmic contact between the p-type GaN layer 147 and the p-type electrode 141. The ohmic contact layer 148 may be made of a transparent metal oxide, such as indium tin oxide (ITO), indium gallium zinc oxide (IGZO), or indium zinc oxide (IZO).

The p-type electrode 141 and the n-type electrode 143 may be formed as a single layer or a multilayer of at least one metal of Ni, Au, Pt, Ti, Al, and Cr or an alloy thereof.

In the LED 140 configured as described above, when a voltage is applied to the p-type electrode 141 and the n-type electrode 143, electrons and holes are injected from the n-type GaN layer 145 and the p-type GaN layer 147, respectively, to the active layer 146. Then, excitons are generated within the active layer 146. As the excitons decay, light corresponding to the energy difference between the lowest unoccupied molecular orbital (LUMO) and the highest occupied molecular orbital (HOMO) of the emission layer is generated and emitted to the outside.

The wavelength of the light luminescent from the LED 140 can be adjusted by adjusting the thickness of the barrier layers in the MQW structure of the active layer 146.

Although not illustrated in the drawings, the LED 140 may be manufactured by forming a buffer layer on a substrate and growing a GaN thin film on the buffer layer. In this case, sapphire, silicon (Si), GaN, silicon carbide (SiC), gallium arsenide (GaAs), zinc oxide (ZnO), etc., may be used as a substrate for growing the GaN thin film.

The n-type GaN layer 145 may be formed by growing a GaN layer 144 not doped with impurities and then doping n-type impurities, such as Si, on an upper part of the undoped thin film. Also, the p-type GaN layer 147 may be formed by growing an undoped GaN thin film and then doping p-type impurities, such as Mg, Zn, and Be.

Although it is illustrated in FIG. 2 that the LED 140 having a specific structure is disposed on the first insulating layer 114, the present disclosure is not limited to the LED 140 having such a specific structure. LEDs in various structures, such as a vertically structured LED and a horizontally structured LED, may be applied.

Referring back to FIG. 2, a second insulating layer 116 may be formed on the first insulating layer 114 on which the LED 140 has been disposed.

The second insulating layer 116 may be formed as an organic layer, such as photo-acryl, or may have a multilayered structure including an inorganic layer and an organic layer or an inorganic layer, an organic layer, and an inorganic layer. The second insulating layer 116 covers an upper part of the LED 140.

A first contact hole 114a and a second contact hole 114b are formed in the first insulating layer 114 and the second insulating layer 116 on the thin film transistor TFT and the second electrode 109, respectively. Thus, the drain electrode 107 and the second electrode 109 of the thin film transistor TFT can be exposed to the outside. In addition, a third contact hole 116a and a fourth contact hole 116b are formed in the second insulating layer 116 on the p-type electrode 141 and the n-type electrode 143, respectively, of the LED 140. Thus, the p-type electrode 141 and the n-type electrode 143 can be exposed to the outside.

Although FIG. 2 illustrates the two insulating layers 114 and 116, this is to suppress an excessive increase in processing time occurring when a single insulating layer is formed. Therefore, it is not necessary to form a plurality of insulating layers 114 and 116, and a single insulating layer may be formed. Also, the number of insulating layers 114 and 116 may be two or more.

A first connection electrode 117a and a second connection electrode 117b made of a transparent metal oxide, such as ITO, IGZO, or IGO, are formed on the second insulation layer 116. Thus, the drain electrode 107 of the thin film transistor TFT and the p-type electrode 141 of the LED 140 may be electrically connected by the first connection electrode 117a through the first contact hole 114a and the third contact hole 116a. Also, the second electrode 109 and the n-type electrode 143 of the LED 140 may be electrically connected by the second connection electrode 117b through the second contact hole 114b and the fourth contact hole 116b.

In addition, a buffer layer 118 made of an inorganic material and/or an organic material may be formed on an upper surface of the substrate 110 so as to cover the LED 140 and the pad 152.

Figure 4:
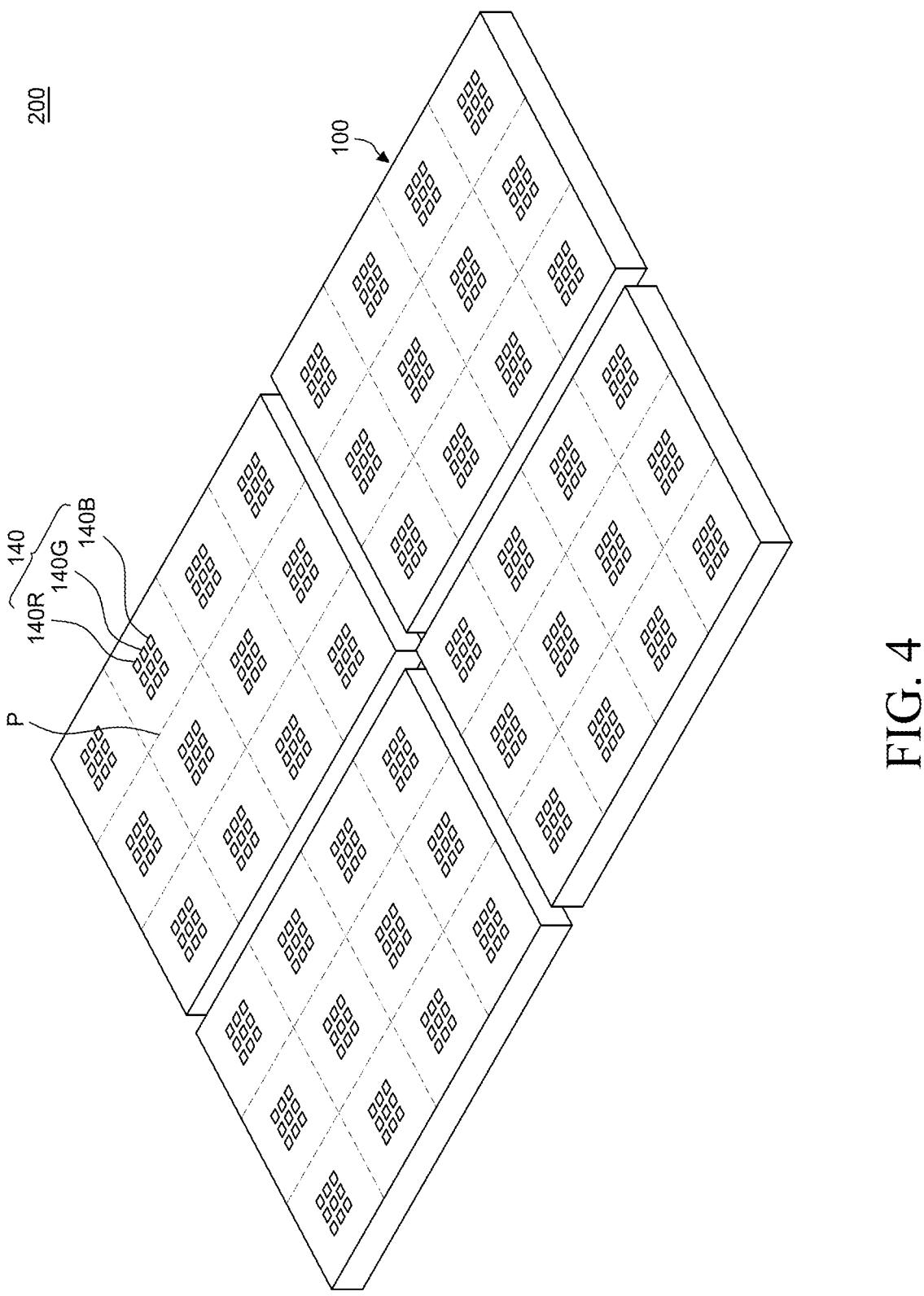
FIG. 4 is a perspective view schematically illustrating a tiling LED display device in which a plurality of LED assemblies is tiled.

FIG. 4 is a perspective view schematically illustrating a tiling LED display device in which a plurality of LED assemblies is tiled.

A tiling LED display device 200 shown in FIG. 4 is a display device in which a plurality of LED assemblies 100 configured as shown in FIG. 1 is tiled. For the convenience of description, FIG. 4 illustrates that four LED assemblies 100 are tiled. However, six, eight or more LED assemblies 100 may be tiled to form the tiling LED display device 200.

Referring to FIG. 4, the tiling LED display device 200 according to the first embodiment of the present disclosure may be formed by placing or connecting a plurality of LED assemblies 100 in a matrix form.

Each LED assembly 100 may include a plurality of pixel areas P (or blocks), and a plurality of LEDs 140 may be disposed in each pixel area P.

The LED 140 may include at least R, G, and B LEDs 140R, 140G, and 140B emitting light of three colors, respectively. The LED 140 may emit white light.

Although not illustrated in the drawings, a gate line, a data line, and a thin film transistor to implement the LED 140 may be formed in each pixel area P of the LED assembly 100.

Meanwhile, the LED display device does not need to be provided with a sealant and an encapsulation unit or structure unlike an LCD device or an OLED device, and, thus, the size of a bezel area can be reduced. Further, in the LED display device, LEDs are designed for each block, which is a minimum unit of a serial configuration of LEDs, to reduce a bezel area, and a film on film (FOF) bonding pad area is reduced. However, in order to reduce the FOF bonding pad area, the order of pads may be changed and the number of layers may be increased according to a via hole avoidance design.

Accordingly, the present inventors have invented an LED display device in which a novel block structure reduces an FOF bonding pad area without a via hole avoidance design and an increase in the number of layers, and, thus, a bezel area can be minimized or reduced.

Figure 5:
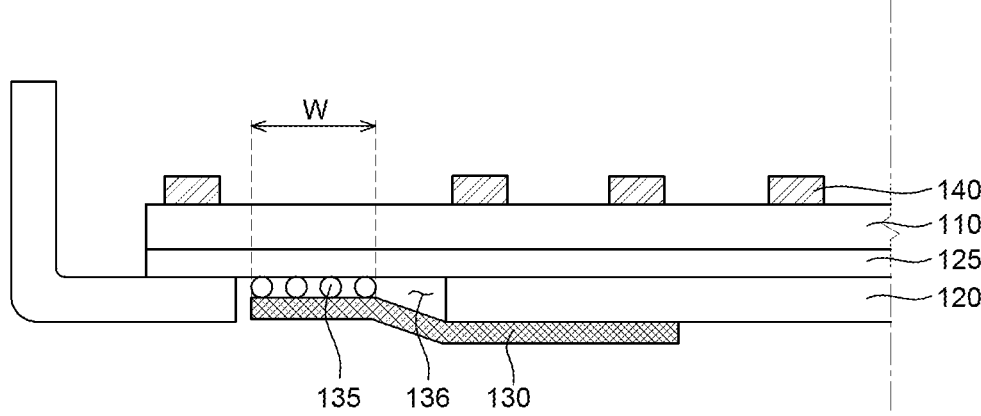
FIG. 5 is a cross-sectional view schematically illustrating an LED display device according to the first embodiment of the present disclosure.

FIG. 5 is a cross-sectional view schematically illustrating an LED display device according to the first embodiment of the present disclosure.

Figure 6:
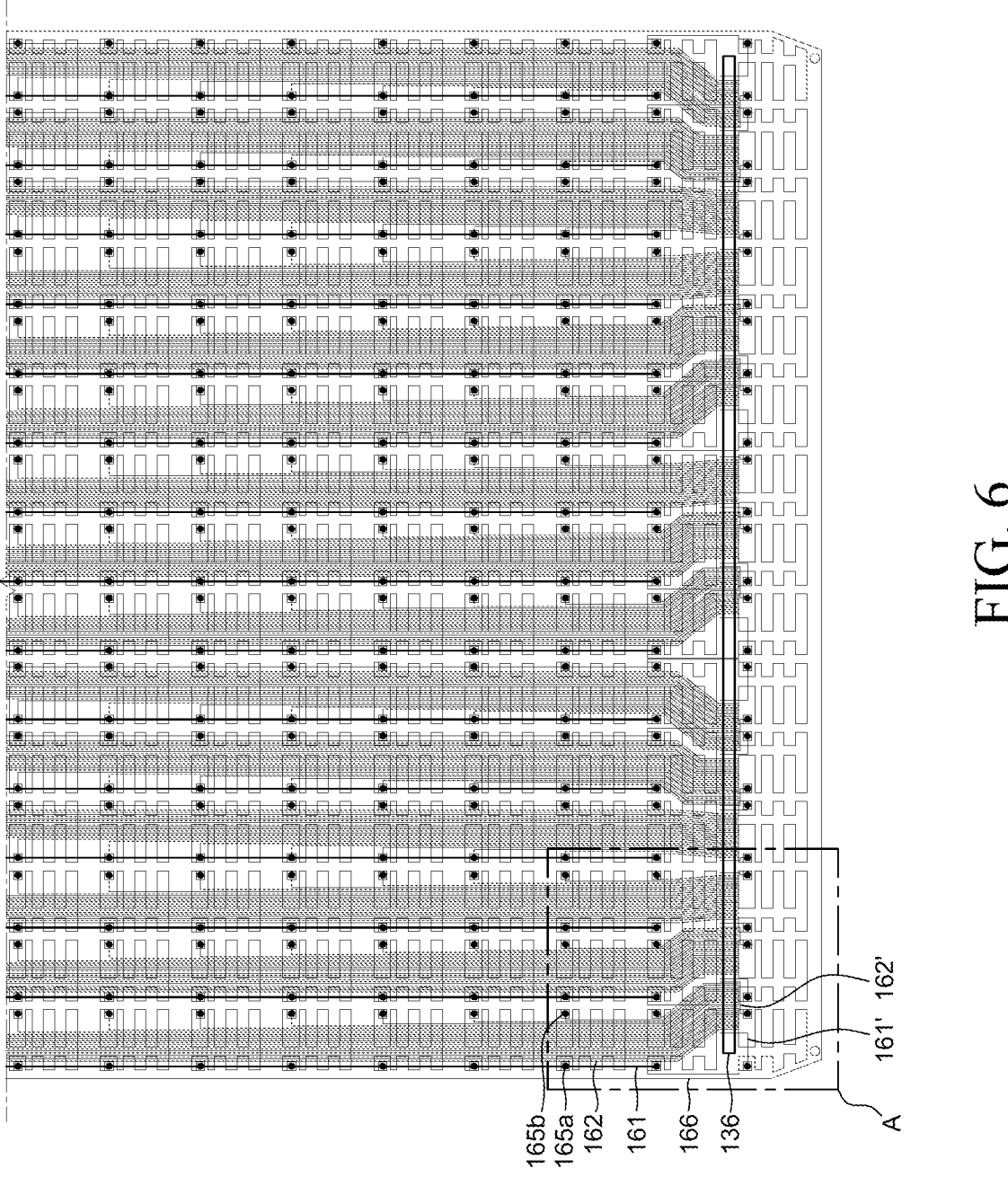
FIG. 6 shows an example of a layout of lines in the LED assembly according to the first embodiment of the present disclosure.

FIG. 6 shows an example of a layout of lines in the LED assembly according to the first embodiment of the present disclosure.

Figure 7:
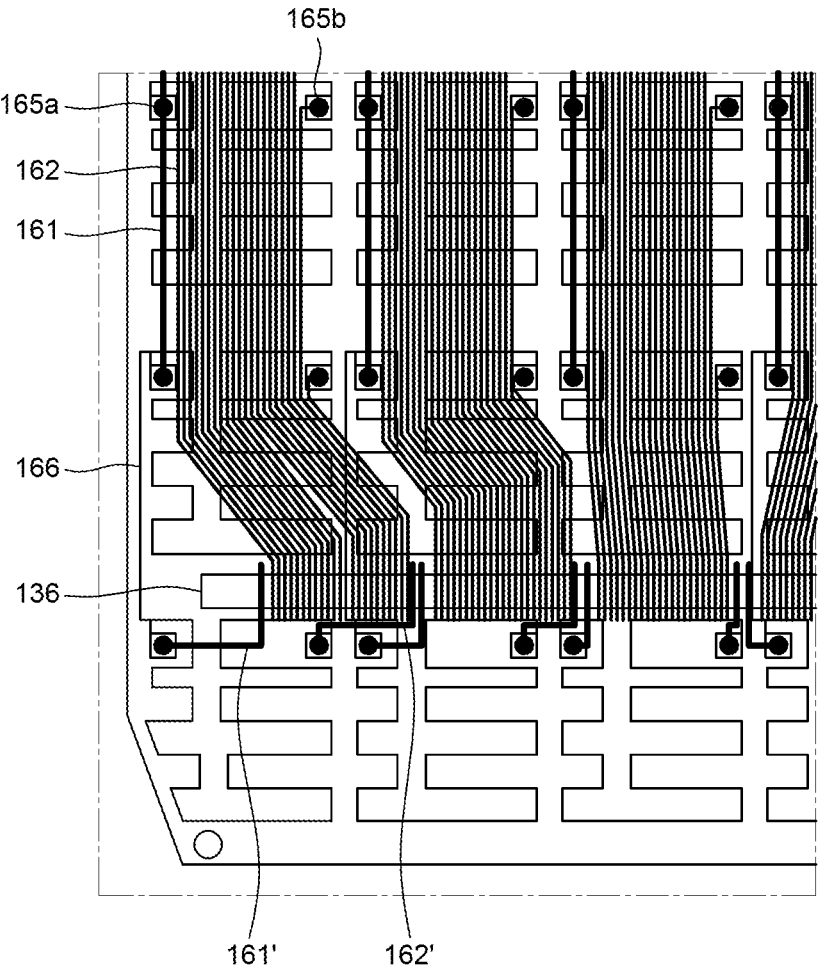
FIG. 7 is an enlarged view of a portion A of FIG. 6.

FIG. 7 is an enlarged view of a portion A of FIG. 6.

FIG. 8 schematically illustrates a block structure illustrated in FIG. 7.

Figure 8A:
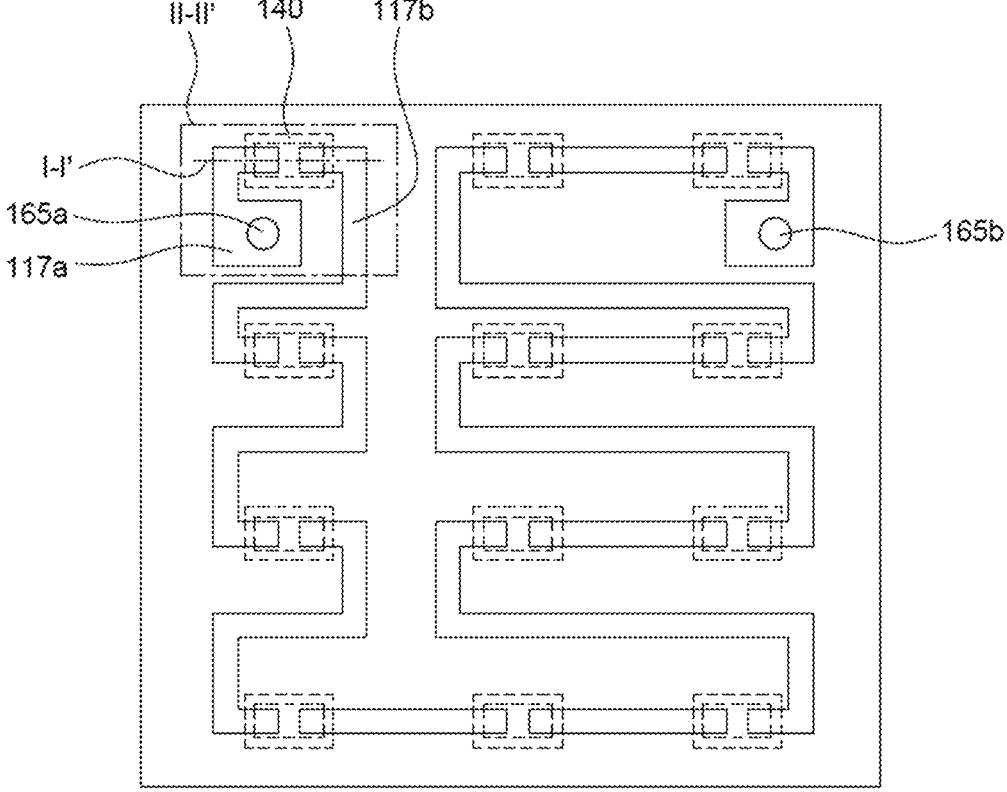
FIG. 8A schematically illustrates a block structure illustrated in FIG. 7.

For the convenience of description, FIG. 8A illustrates an area where the LEDs 140 are mounted.

Referring to FIG. 5 through FIGS. 8A-8B, the LED display device according to the first embodiment of the present disclosure may include the main FPCB 110 where the plurality of LEDs 140 is mounted. Also, the LED display device may include a sub-FPCB 130 connected to the main FPCB 110 and a cover bottom 120 in which the plurality of LEDs 140 and the main FPCB 110 are accommodated.

For example, the LED 140, the main FPCB 110, and sub-FPCB 130 may form a backlight unit or backlight. In this case, a liquid crystal panel (not shown) may be disposed above the backlight unit and the cover bottom 120 configured to cover the backlight unit may be disposed under the backlight unit. However, the present disclosure is not limited thereto. The LED 140 itself may implement an image. In this case, a liquid crystal panel may not be required.

The main FPCB 110 may be attached to an inner upper surface of the cover bottom 120 by a predetermined or selected adhesive layer 125. In this case, a connector for example, anisotropic conductive film (ACF) 135 connected to the sub-FPCB 130 is provided on a rear surface of the main FPCB 110. Also, the sub-FPCB 130 may be connected to the ACF 135 on the rear surface of the main FPCB 110 and then connected to the outside through an open area 136 formed in the cover bottom 120.

One end of the sub-FPCB 130 may be bent to the rear surface of the main FPCB 110 and located within the open area 136, and may be connected to the main FPCB 110 through the ACF 135.

Meanwhile, according to the first embodiment of the present disclosure, the plurality of LEDs 140 is not disposed in the open area 136. That is, the LED 140 is disposed to avoid an FOF bonding pad area W within the open area 136. Thus, it is possible to suppress damage to the LED 140 caused by being pressed when bonding the main FPCB 110 and the sub-FPCB 130 to each other.

Also, according to the first embodiment of the present disclosure, a connector between an anode and a cathode and via holes 165a and 165b are aligned in a horizontal direction within a block. Also, blocks on and under the open area 136 are connected on the same layer by a third connection line 166.

That is, in each block, the plurality of LEDs 140 is disposed in series by the first connection electrode 117a and the second connection electrode 117b. Also, a first via hole 165a and a second via hole 165b are provided at one end of the first connection electrode 117a and one end of the second connection electrode 117b, respectively, and thus can be connected to a first connection line 161 and a second connection line 162.

Actually, the first connection electrode 117a and the second connection electrode 117b may refer to the same component. For the convenience of description, the first connection electrode 117a may refer to an electrode located on the anode side of the LED 140 and the second connection electrode 117b may refer to an electrode located on the cathode side of the LED 140.

FIG. 8A illustrates an example where twelve LEDs 140 are disposed in series by the first connection electrode 117a and the second connection electrode 117b. However, the present disclosure is not limited to the number of LEDs 140 disposed in each block. The line I-I' corresponds to the cross-sectional view of FIG. 2. The box II-II' corresponds to the expanded view of FIG. 8B.

Also, the one end of the first connection electrode 117a is exposed by the first via hole 165a. The first connection electrodes 117a of blocks vertically adjacent to each other may be connected to each other by the first connection lines 161 disposed in a vertical direction through the first via holes 165a of the blocks vertically adjacent to each other.

In this case, the first connection line 161 may be provided in each column, and blocks in the same column except the block under the open area 136 may be connected to each other by the same first connection line 161.

One end of each first connection line 161 may be connected to the first connection electrode 117a of the block on the open area 136 through the first via hole 165a. Also, the first connection electrodes 117a of the blocks on and under the open area 136 may be connected to each other by a third connection line 166. In this case, the first connection electrode 117a and the third connection line 166 may be disposed on the same layer, and the first connection electrode 117a and the first connection line 161 may be disposed on different layers. However, the present disclosure is not limited thereto.

Also, the block under the open area 136 further includes a first sub-connection line 161'. One end of the first sub-connection line 161' may be connected to the first connection electrode 117a through the first via hole 165a and the other end may be extended to the open area 136. The first connection electrode 117a and the first sub-connection line 161' may be disposed on different layers. However, the present disclosure is not limited thereto.

A plurality of second connection lines 162 may be provided in each column. The second connection lines 162 corresponding in number to the number of blocks disposed in each column except the block under the open area 136 may be provided. For example, in the same column, one ends of the second connection electrodes 117b of blocks in respective rows may be connected to the second connection lines 162 through the second via holes 165b of the blocks in the respective rows. That is, in the same column, one end of the second connection electrode 117b of a block in a first row may be connected to the second connection line 162 disposed first on the leftmost side of the same column through the second via hole 165b of the block in the first row. Also, one end of the second connection electrode 117b of a block in a second row may be connected to the second connection line 162 disposed second in the same column through the second via hole 165b of the block in the second row. Further, one end of the second connection electrode 117b of a block in an n−1th row may be connected to the second connection line 162 disposed last on the rightmost side of the same column through the second via hole 165b of the block in the n−1th row. Herein, n refers to the total number of blocks in each row, and the block in the n−1th row may refer to the block on the open area 136.

Also, a block in an nth row, e.g., the block under the open area 136, further includes a second sub-connection line 162'. One end of the second sub-connection line 162' may be connected to the second connection electrode 117b through the second via hole 165b and the other end may be extended to the open area 136. The second connection electrode 117b and the second sub-connection line 162' may be disposed on different layers. However, the present disclosure is not limited thereto.

Meanwhile, in the first embodiment of the present disclosure, the first and second via holes 165a and 165b are disposed within the blocks. Also, the connector between the anode and the cathode (e.g., portions connecting the first connection electrode 117a and the second connection electrode 117b to the first connection line 161 and the second connection line 162, respectively) and the first and second via holes 165a and 165b are aligned in the horizontal direction. That is, since the first and second via holes 165a and 165b are disposed within the blocks, it is possible to suppress an increase in size of a bezel area caused by the first and second via holes 165a and 165b. Also, since the connector between the anode and the cathode and the first and second via holes 165a and 165b are aligned in the horizontal direction, it is possible to more densely dispose a plurality of second connection lines 162 in the open area 136. Therefore, it is possible to reduce the width of the open area 136. That is, the connector between the anode and the cathode and the first and second via holes 165a and 165b are disposed at an upper end of the block in the n–1th row and aligned in the horizontal direction. Thus, a plurality of second connection lines 162 can be bent toward the center while avoiding the second via hole 165b. Therefore, it is possible to more densely dispose the plurality of second connection lines 162 in the open area 136. Accordingly, it is possible to reduce a routing area and a bezel area. Also, it is possible to reduce costs of the sub-FPCB 130 and reduce process errors.

Figure 8B:
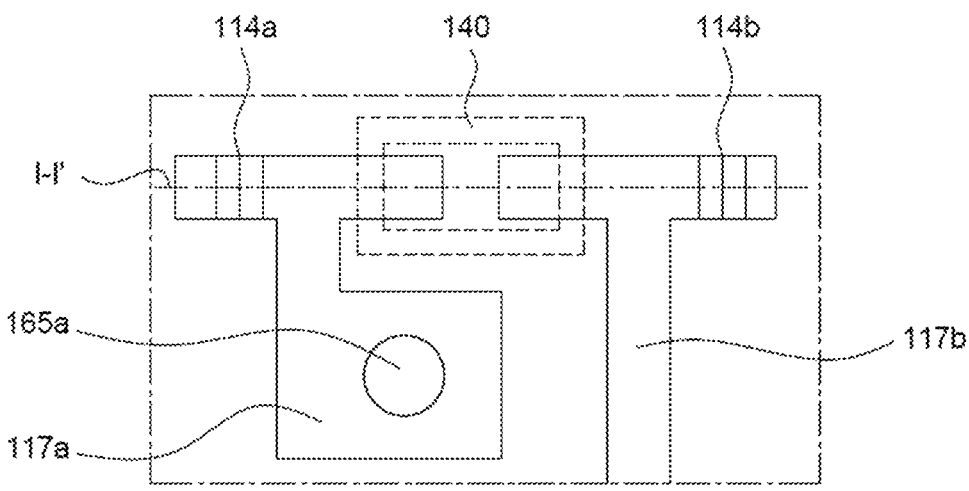
FIG. 8B shows an expansion of the box II-II' shown in FIG. 8A.

FIG. 8B shows an expansion of the box II-II' shown in FIG. 8A. The line I-I' corresponds to the cross-sectional view of FIG. 2. FIG. 8B illustrates the positioning of the first contact hole 114a and the second contact hole 114b shown in FIG. 2. By reference to FIGS. 2, 6, 7, 8A and 8B, the one end of the first connection electrode 117a is exposed by the first via hole 165a, and the one end of the second connection electrode 117b is exposed by the second via hole 165b. The first connection electrodes 117a of blocks vertically adjacent to each other may be connected to each other by the first connection lines 161 disposed in a vertical direction through the first via holes 165a of the blocks vertically adjacent to each other.

Figure 9:
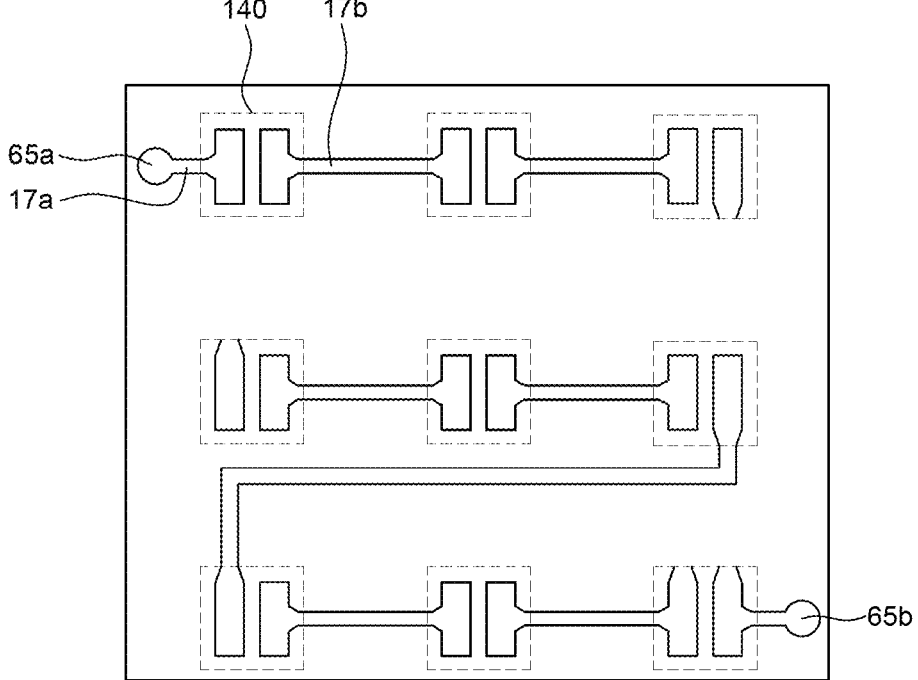
FIG. 9 illustrates an example of a block structure according to a comparative embodiment.

FIG. 9 illustrates an example of a block structure according to a comparative embodiment.

Figure 10:
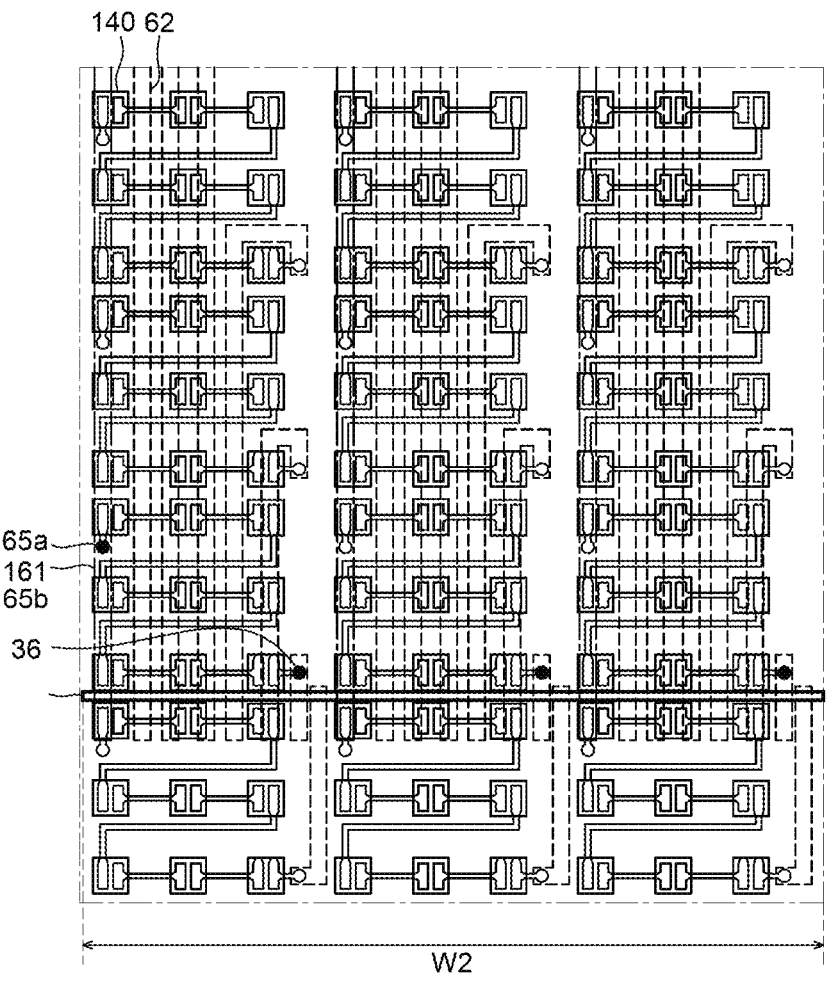
FIG. 10 shows an example of a layout of lines in an LED assembly according to the comparative embodiment.

FIG. 10 shows an example of a layout of lines in an LED assembly according to the comparative embodiment.

Referring to FIG. 9 and FIG. 10, it can be seen in the comparative embodiment that first and second via holes 65a and 65b are disposed outside a block. Also, it can be seen that a connector between an anode and a cathode, e.g., portions connecting a first connection electrode 17a and a second connection electrode 17b to a first connection line and a second connection line, respectively, and the first and second via holes 65a and 65b are misaligned in the horizontal direction.

When the first and second via holes 65a and 65b are disposed outside the block as in the comparative embodiment, the size of a bezel area increases by the protruded width of the first and second via holes 65a and 65b outside the block.

Also, when the connector between the anode and the cathode and the first and second via holes 65a and 65b are misaligned in the horizontal direction, the second connection lines illustrated in FIG. 6 and FIG. 7 of the present disclosure described above cannot be disposed. That is, in the comparative embodiment, a plurality of second connection lines 62 cannot be bent toward the center while avoiding the second via hole 65b. Therefore, a miniaturization design of a routing area cannot be achieved. Also, when a via hole avoidance design is implemented, the order of pads may be changed or the number of layers may be increased.

Accordingly, in the comparative embodiment, a width W2 of an open area 36 cannot be reduced, which results in an increase in size of a bezel area.

Figure 11:
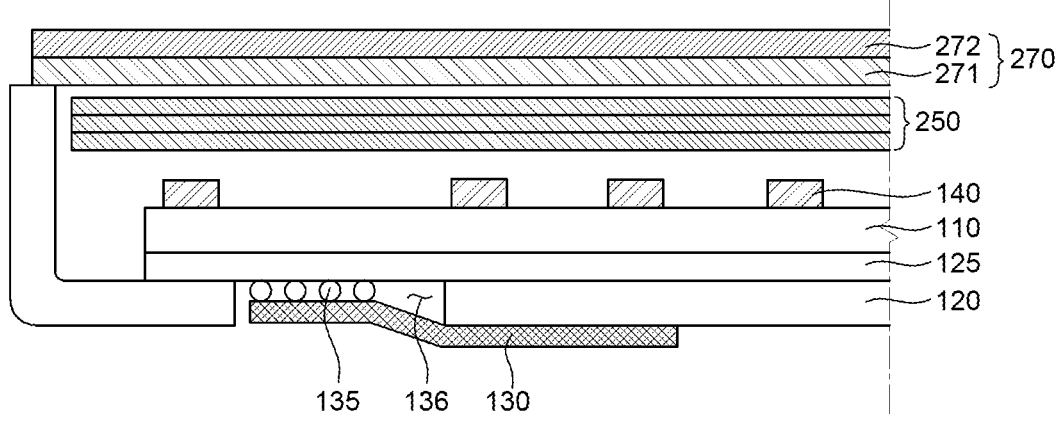
FIG. 11 is a cross-sectional view schematically illustrating an LED display device according to a second embodiment of the present disclosure.

FIG. 11 is a cross-sectional view schematically illustrating an LED display device according to a second embodiment of the present disclosure.

The second embodiment of the present disclosure shown in FIG. 11 is substantially the same as the above-described first embodiment except that a liquid crystal panel 270 is provided at an upper part of a backlight unit. Therefore, a redundant description thereof will be omitted.

Referring to FIG. 11, the LED display device according to the second embodiment of the present disclosure may largely include the liquid crystal panel 270 and the backlight unit disposed under the liquid crystal panel and supply backlight to the liquid crystal panel.

Here, the backlight unit may include a plurality of optical sheets 250 and the main FPCB 110 where the plurality of LEDs 140 is mounted. Also, the backlight unit may include the sub-FPCB 130 connected to the main FPCB 110 and the cover bottom 120 in which the plurality of LEDs 140 and the main FPCB 110 are accommodated.

The liquid crystal panel 270 may include pixels disposed in a matrix form to output an image. Also, the liquid crystal panel 270 may include a color filter substrate 272 and an array substrate 271 that face each other and are bonded to each other to maintain a uniform cell gap. Further, the liquid crystal panel 270 may include a liquid crystal layer formed in the cell gap between the color filter substrate 272 and the array substrate 271.

Although not specifically illustrated, a common electrode and a pixel electrode may be formed on the liquid crystal panel 270, with the color filter substrate 272 and the array substrate 271 being bonded to each other, to apply an electric field to the liquid crystal layer. When a voltage of a data signal applied to the pixel electrode is controlled in a state where a voltage is applied to the common electrode, liquid crystals of the liquid crystal layer may be rotated due to dielectric anisotropy according to an electric field between the common electrode and the pixel electrode. Thus, the liquid crystals may transmit or block light for each pixel to display text or images.

In this case, to control the voltage of the data signal applied to the pixel electrode for each pixel, switching devices such as thin film transistors (TFTs) may be respectively provided in pixels. That is, a gate line and a data line vertically and horizontally arranged to define a pixel area may be disposed on the array substrate 271, and a TFT as a switching device may be formed at an area of overlap between the gate line and the data line.

The TFT may include a gate electrode connected to the gate line, a source electrode connected to the data line, and a drain electrode connected to the pixel electrode.

The color filter substrate 272 may include a color filter including a plurality of sub-color filters for implementing red, green, and blue colors and a black matrix that may separate the sub-color filters and block light transmitted through the liquid crystal layer. Also, the color filter substrate 272 may include an overcoat layer provided on the color filter and the black matrix.

Polarizing plates may be attached to the outside of the color filter substrate 272 and the array substrate 271, respectively. The lower polarizing plate may polarize light transmitted through the backlight unit in a direction toward the array substrate 271, and the upper polarizing plate may polarize light transmitted through the liquid crystal panel 270.

Also, a guide panel may be provided at the edges of the backlight unit under the liquid crystal panel 270. The guide panel may support the upper liquid crystal panel 270 and may accommodate therein the cover bottom 120 together with the backlight unit disposed therein.

The plurality of optical sheets 250 for enhancing the efficiency of light emitted from a light source and emitting light to the liquid crystal panel 270 may be provided on an LED assembly.

Meanwhile, the main FPCB 110 may be attached to an inner upper surface of the cover bottom 120 by the adhesive layer 125. A connector, for example, anisotropic conductive film 135 connected to the sub-FPCB 130 may be provided on a rear surface of the main FPCB 110. Also, the sub-FPCB 130 may be connected to the ACF 135 on the rear surface of the main FPCB 110 and then connected to the outside through the open area 136 formed in the cover bottom 120.

One end of the sub-FPCB 130 may be bent to the rear surface of the main FPCB 110 and located within the open area 136, and may be connected to the main FPCB 110 through the ACF 135.

According to the second embodiment of the present disclosure, the plurality of LEDs 140 is not disposed in the open area 136 as in the above-described first embodiment.

Meanwhile, according to the first embodiment of the present disclosure, the blocks on and under the open area are connected on the same layer through the third connection line, but the present disclosure is not limited thereto. The blocks on and under the open area may be connected by first connection line. This will be described in detail with reference to FIG. 11.

Figure 12:
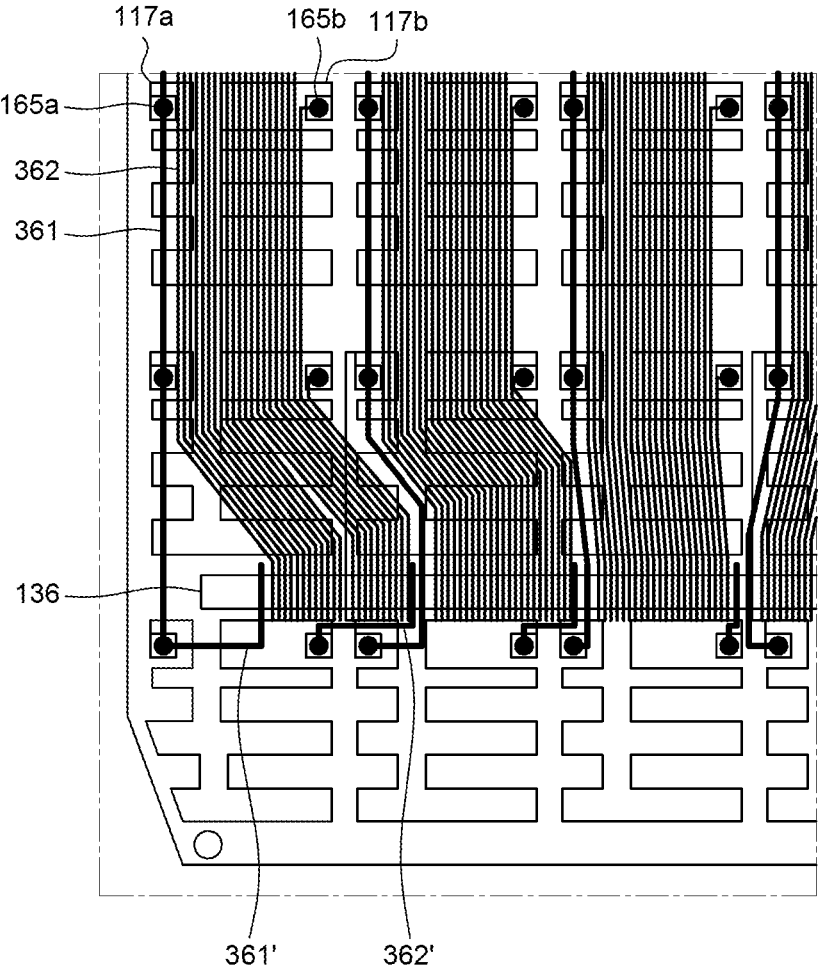
FIG. 12 shows an example of a layout of lines in an LED assembly according to a third embodiment of the present disclosure.

FIG. 12 shows an example of a layout of lines in an LED assembly according to a third embodiment of the present disclosure.

The third embodiment of the present disclosure shown in FIG. 12 is substantially the same as the above-described first embodiment except that blocks on and under the open area 136 are connected by a first connection line 361. Therefore, a redundant description thereof will be omitted.

Referring to FIG. 12, in the third embodiment of the present disclosure, the connector between the anode and the cathode and the first and second via holes 165a and 165b are aligned in the horizontal direction within a block. Also, the blocks on and under the open area 136 are connected by the first connection line 361.

That is, in each block, a plurality of LEDs (not shown) is disposed in series by the first connection electrode 117a and the second connection electrode 117b. Also, the first via hole 165a and the second via hole 165b are provided at one end of the first connection electrode 117a and one end of the second connection electrode 117b, respectively, and thus can be connected to the first connection line 361 and a second connection line 362.

Here, as described above, for the convenience of description, the first connection electrode 117a may refer to an electrode located on the anode side of the LED and the second connection electrode 117b may refer to an electrode located on the cathode side of the LED.

The one end of the first connection electrode 117a is exposed by the first via hole 165a. The first connection electrodes 117a of blocks vertically adjacent to each other may be connected to each other by the first connection lines 361 disposed in a vertical direction through the first via holes 165a of the blocks vertically adjacent to each other.

In this case, the first connection line 361 may be provided in each column, and blocks in the same column may be connected to each other by the same first connection line 361. Therefore, the third connection line described in the first embodiment is not required, and, thus, it is possible to further reduce a bezel area.

That is, one ends of the first connection lines 361 may be respectively connected to the first connection electrodes 117a of the blocks in the same column through the first via holes 165a. In this case, the first connection electrode 117a and the first connection line 361 may be disposed on different layers. However, the present disclosure is not limited thereto.

Also, the block under the open area 136 further includes a first sub-connection line 361'. One end of the first sub-connection line 361' may be connected to the first connection line 361 through the first via hole 165a and the other end may be extended to the open area 136. The first connection electrode 117a and the first sub-connection line 361' may be disposed on different layers. However, the present disclosure is not limited thereto.

Further, a plurality of second connection lines 362 may be provided in each column. The second connection lines 362 corresponding in number to the number of blocks disposed in each column except the block under the open area 136 may be provided. For example, in the same column, one ends of the second connection electrodes 117b of blocks in respective rows may be connected to the second connection lines 362 through the second via holes 165b of the blocks in the respective rows. That is, in the same column, one end of the second connection electrode 117b of a block in a first row may be connected to the second connection line 362 disposed first on the leftmost side of the same column through the second via hole 165b of the block in the first row. Also, one end of the second connection electrode 117b of a block in a second row may be connected to the second connection line 362 disposed second in the same column through the second via hole 165b of the block in the second row. Further, one end of the second connection electrode 117b of a block in an n−1th row may be connected to the second connection line 362 disposed last on the rightmost side of the same column through the second via hole 165b of the block in the n−1th row. Herein, n refers to the total number of blocks in each row, and the block in the n−1th row may refer to the block on the open area 136.

Also, a block in an nth row, e.g., the block under the open area 136, further includes a second sub-connection line 362'. One end of the second sub-connection line 362' may be connected to the second connection electrode 117b through the second via hole 165b and the other end may be extended to the open area 136. The second connection electrode 117b and the second sub-connection line 362' may be disposed on different layers. However, the present disclosure is not limited thereto.

Meanwhile, in the third embodiment of the present disclosure, the first and second via holes 165a and 165b are disposed within the blocks. Also, the connector between the anode and the cathode and the first and second via holes 165a and 165b are aligned in the horizontal direction. Therefore, it is possible to suppress an increase in size of a bezel area caused by the first and second via holes 165a and 165*b*. Also, it is possible to more densely dispose a plurality of second connection lines 362 in the open area 136 and thus possible to reduce the width of the open area 136. Accordingly, it is possible to reduce a routing area and a bezel area. Also, it is possible to reduce costs of the sub-FPCB and reduce process errors.

Figure 13:
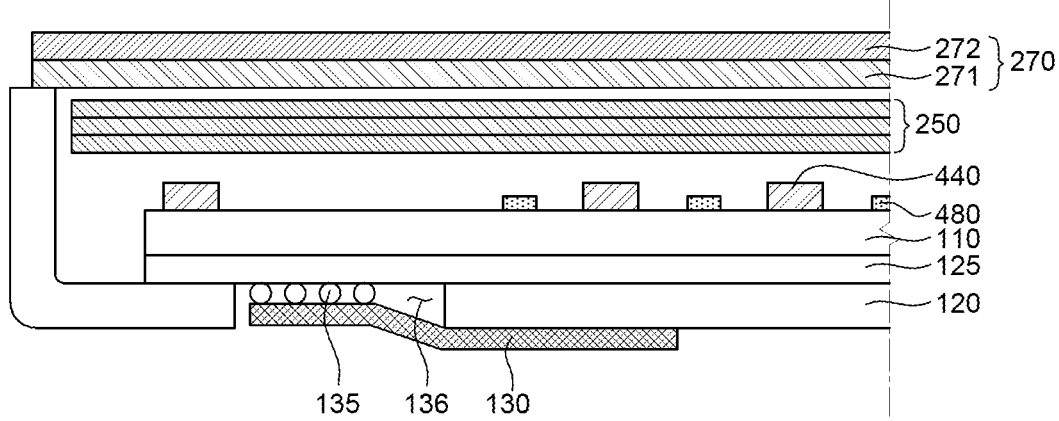
FIG. 13 is a cross-sectional view schematically illustrating an LED display device according to a fourth embodiment of the present disclosure.

FIG. 13 is a cross-sectional view schematically illustrating an LED display device according to a fourth embodiment of the present disclosure.

The fourth embodiment of the present disclosure shown in FIG. 13 is substantially the same as the above-described second embodiment except that a sensor unit or sensor 480 is disposed between a plurality of LEDs 440. Therefore, a redundant description thereof will be omitted.

Referring to FIG. 13, the LED display device according to the fourth embodiment of the present disclosure may largely include the liquid crystal panel 270 and the backlight unit disposed under the liquid crystal panel and supply backlight to the liquid crystal panel.

Here, the backlight unit may include the plurality of optical sheets 250 and the main FPCB 110 where the plurality of LEDs 440 is mounted. Also, the backlight unit may include the sub-FPCB 130 connected to the main FPCB 110 and the cover bottom 120 in which the plurality of LEDs 440 and the main FPCB 110 are accommodated.

In this case, an LED assembly may include the plurality of LEDs 440 and the main FPCB 110 where the plurality of LEDs 440 is mounted.

The optical sheet 250 is disposed on the LED assembly, and the cover bottom 120 is disposed under the LED assembly. Thus, the LED assembly and the optical sheet 250 may be accommodated within the cover bottom 120.

The optical sheet 250 may include at least one of a diffusion sheet, a prism sheet, a brightness enhancement film, such as DBEF, and a protective sheet.

The sensor unit 480 may be provided on the main FPCB 110. Each sensor unit 480 may be disposed between adjacent ones of the plurality of LEDs 440.

The sensor unit 480 may include at least one of a proximity sensor, an illumination sensor, a fingerprint sensor, a near infrared (N-IR) chip, and an ultraviolet (UV) chip.

As for a portable terminal, a proximity sensor and an illumination sensor are disposed over a front surface of the portable terminal. Therefore, it is beneficial to provide a non-display area mainly for the proximity sensor and the illumination sensor. However, when the sensor unit 480 is disposed between the LEDs 440, it is possible to reduce a non-display area. Thus, it is possible to implement a slim bezel structure or a bezel-less structure. In a conventional fingerprint sensor, fingerprint recognition is possible only at a predetermined or selected position by using a physical button. However, when a fingerprint sensor is disposed between the LEDs 440, a fingerprint can be easily recognized at any portion of a display area.

An N-IR chip provides a skin care function, such as skin whitening, removal of dead skin cells, suppression of sebum secretion, and a reduction in size of skin pores, using near infrared light. The N-IR chip stimulates the epidermis and dermis using red-based LED light having a wavelength of from about 600 to about 700 nm and IR LED light having a wavelength of from about 800 to about 980 nm. Thus, the N-IR chip provides an effect enabling the skin to induce self-healing when stimulated.

Also, a UV chip provides sterilization effects using UV light. For example, a user may easily sterilize an area to be sterilized by using a portable terminal provided with the UV chip. Furthermore, in this case, the portable terminal can be used in a relatively clean condition.

The embodiments of the present disclosure can also be described as follows:

According to an aspect of the present disclosure, there is provided a display device. The display device includes a main FPCB including a plurality of LEDs in a block unit or block on one surface and a connector connected to the LEDs on the other surface; a sub-FPCB connected to the connector of the main FPCB; and a cover bottom in which the main FPCB is disposed and the sub-FPCB is connected to the outside through an open area, wherein in each block, the plurality of LEDs is disposed in series by a plurality of first connection electrodes and second connection electrodes, wherein the first and second via holes are disposed within the blocks, and one end of the first connection electrode and one end of the second connection electrode are exposed by a first via hole and a second via hole.

The LED may be not disposed at a position facing the open area.

The first connection electrode may be located on an anode side of the LED, and the second connection electrode may be located on a cathode side of the LED.

The display device may further include a first connection line disposed on the main FPCB in a row direction, wherein the first connection electrodes of the plurality of LEDs may be connected to each other by the first connection lines through the first via holes of the plurality of LEDs in the row direction.

The first connection line may be provided in each column, and blocks in the same column except a block under the open area may be connected to each other by the same first connection line.

One end of each first connection line may be connected to the first connection electrode of a block on the open area through the first via hole, and the first connection electrodes of the blocks on and under the open area may be connected to each other by a third connection line.

The first connection line may be provided in each column, and blocks in the same column may be connected to each other by the same first connection line.

One ends of the first connection lines may be respectively connected to the first connection electrodes of the blocks in the same column through the first via holes.

The block under the open area may further include a first sub-connection line, and one end of the first sub-connection line may be connected to the first connection electrode through the first via hole and the other end may be extended to the open area.

A plurality of second connection lines may be provided in each column, and the second connection lines corresponding in number to the number of blocks disposed in each column except the block under the open area may be provided.

In the same column, one ends of the second connection electrodes of blocks in respective rows may be connected to the second connection lines through the second via holes of the blocks in the respective rows.

In the same column, one end of the second connection electrode of a block in a first row may be connected to the second connection line disposed first on the leftmost side of the same column through the second via hole of the block in the first row, one end of the second connection electrode of a block in a second row may be connected to the second connection line disposed second in the same column through the second via hole of the block in the second row, one end of the second connection electrode of a block in an n−1th row may be connected to the second connection line disposed last on the rightmost side of the same column through the second via hole of the block in the n−1th row, n refers to the total number of blocks in each row, and the block in the n−1th row refers to the block on the open area.

A block in an nth row may further include a second sub-connection line, and one end of the second sub-connection line may be connected to the second connection electrode through the second via hole and the other end may be extended to the open area.

In the block in the n−1th row, the plurality of second connection lines may be bent toward a center of the open area while avoiding the second via hole thus may be more densely disposed in the open area.

The first via hole and the second via hole are disposed in the same line in a column direction. Portions connecting the first connection electrode and the second connection electrode to the first connection line and the second connection line, respectively, and the first and second via holes may be located in the same line in the column direction.

The LED is disposed at a position facing the open area.

The display device may further include a sensor unit disposed between the plurality of LEDs.

Although the embodiments of the present disclosure have been described in detail with reference to the accompanying drawings, the present disclosure is not limited thereto and may be embodied in many different forms without departing from the technical concept of the present disclosure. Therefore, the embodiments of the present disclosure are provided for illustrative purposes only but not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/ or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
a main flexible printed circuit board (FPCB) including a plurality of light emitting diodes (LEDs) in a plurality of blocks on one surface, and a connector connected to the plurality of LEDs on another surface;
a sub-FPCB connected to the connector of the main FPCB;
a cover bottom in which the main FPCB is disposed and the sub-FPCB is connected to the outside through an open area; and
a plurality of first connection lines disposed on the main FPCB in a row direction, wherein;
in each of the plurality of blocks, LEDs of the plurality of LEDs therein are disposed in series by a plurality of first connection electrodes and second connection electrodes, wherein first via holes and second via holes are disposed within the plurality of blocks;
one end of the first connection electrode is exposed by a respective one of the first via holes, and one end of the second connection electrode is exposed by a respective one of the second via holes;
the first connection electrode is located on an anode side of the LEDs, and the second connection electrode is located on a cathode side of the LEDs; and
the first connection electrodes of the plurality of LEDs are connected to each other by the plurality of first connection lines through the first via holes of the plurality of LEDs in the row direction.

2. The display device according to claim 1, wherein the plurality of LEDs are not disposed at a position facing the open area.

3. The display device according to claim 1, wherein the plurality of LEDs is disposed at a position facing the open area.

4. The display device according to claim 1, wherein the first via hole and the second via hole are disposed in the same line in a column direction.

5. The display device according to claim 4, wherein portions connecting the first connection electrode and the second connection electrode to one of the plurality of first connection lines and a second connection line, respectively, and the first and second via holes are located in the same line in the column direction.

6. The display device according to claim 1, wherein the plurality of first connection lines is provided in each column, and blocks in the same column except a block under the open area are connected to each other by the same first connection line.

7. The display device according to claim 6, wherein one end of each of the plurality of first connection lines is connected to the first connection electrode of a respective block on the open area through the first via hole, and the first connection electrodes of the blocks on and under the open area are connected to each other by a third connection line.

8. The display device according to claim 7, wherein the block under the open area further includes a first sub-connection line, and one end of the first sub-connection line is connected to the first connection electrode through the first via hole and the other end is extended to the open area.

9. The display device according to claim 8, wherein a plurality of second connection lines is provided in each column, and the second connection lines are providing having number corresponding to the number of blocks disposed in each column except the block under the open area.

10. The display device according to claim 9, wherein in the same column, first ends of the second connection electrodes of blocks in respective rows are connected to the second connection lines through the second via holes of the blocks in the respective rows.

11. The display device according to claim 10, wherein in the same column, one end of the second connection electrode of a block in a first row is connected to the second connection line disposed first on the leftmost side of the same column through the second via hole of the block in the first row, one end of the second connection electrode of a block in a second row is connected to the second connection line disposed second in the same column through the second via hole of the block in the second row, one end of the second connection electrode of a block in an n−1th row is connected to the second connection line disposed last on the rightmost side of the same column through the second via hole of the block in the n−1th row, n refers to the total number of blocks in each row, and the block in the n−1th row refers to the block on the open area.

12. The display device according to claim 11, wherein a block in an nth row further includes a second sub-connection line, and one end of the second sub-connection line is connected to the second connection electrode through the second via hole and the other end is extended to the open area.

13. The display device according to claim 11, wherein in the block in the n−1th row, the plurality of second connection lines is bent toward a center of the open area while avoiding the second via hole and thus is more densely disposed in the open area.

* * * * *